United States Patent
Van De Kerkhof (10) Patent No.: US 12,001,149 B2
(45) Date of Patent: Jun. 4, 2024

(54) COMPONENT FOR USE IN A LITHOGRAPHIC APPARATUS, METHOD OF PROTECTING A COMPONENT AND METHOD OF PROTECTING TABLES IN A LITHOGRAPHIC APPARATUS

(71) Applicant: ASML Netherlands B.V., Veldhoven (NL)

(72) Inventor: Marcus Adrianus Van De Kerkhof, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 253 days.

(21) Appl. No.: 17/428,897

(22) PCT Filed: Jan. 24, 2020

(86) PCT No.: PCT/EP2020/051775
§ 371 (c)(1),
(2) Date: Aug. 5, 2021

(87) PCT Pub. No.: WO2020/160938
PCT Pub. Date: Aug. 13, 2020

(65) Prior Publication Data
US 2022/0075279 A1  Mar. 10, 2022

(30) Foreign Application Priority Data
Feb. 8, 2019 (EP) .................................... 19156202

(51) Int. Cl.
*G03F 7/00* (2006.01)
*G03F 1/38* (2012.01)
(Continued)

(52) U.S. Cl.
CPC ............ *G03F 7/70925* (2013.01); *G03F 1/38* (2013.01); *G03F 1/82* (2013.01); *H01L 21/67028* (2013.01)

(58) Field of Classification Search
CPC .. G03F 7/707; G03F 7/70708; G03F 7/70733; G03F 7/70908; G03F 7/70916; G03F 7/70925; G03F 7/70933
See application file for complete search history.

(56) References Cited

U.S. PATENT DOCUMENTS 6,413,701 B1    7/2002  Van Empel et al.
6,897,945 B1 *  5/2005  Ottens ................ G03F 7/70875
                                                355/75
(Continued)

FOREIGN PATENT DOCUMENTS

JP          59132139 A  *  7/1984  ............. H01L 21/68
JP        2006-119477 A      5/2006
WO     WO-2020096638 A1 *    5/2020

OTHER PUBLICATIONS

Machine translation of JP 59132139 A (Year: 1984).*
(Continued)

*Primary Examiner* — Steven Whitesell Gordon
(74) *Attorney, Agent, or Firm* — Sterne, Kessler, Goldstein & Fox P.L.L.C.

(57) ABSTRACT

A method of protecting a component of a lithographic apparatus, the method including the steps of: providing a protective cover which is shaped to protect at least part of said component, the protective cover having a contact surface which is arranged to adhere to a first surface of at least part of said lithographic apparatus or said component; and bringing the protective cover into proximity with the component so as to cause the contact surface to adhere to the lithographic apparatus or said component and remain adhered without the application of external force. It is also (Continued)

provided a patterning device for use in a lithographic apparatus and a lithographic apparatus.

7 Claims, 3 Drawing Sheets

(51) Int. Cl.
*G03F 1/82* (2012.01)
*H01L 21/67* (2006.01)

(56) References Cited

U.S. PATENT DOCUMENTS

| | | | |
|---|---|---|---|
| 7,956,382 B2 | 6/2011 | Fonstad, Jr. et al. | |
| 10,274,844 B1* | 4/2019 | Chung | G03F 7/70741 |
| 2005/0191565 A1 | 9/2005 | Ramamoorthy et al. | |
| 2008/0174749 A1 | 7/2008 | Ramamoorthy et al. | |
| 2008/0257383 A1* | 10/2008 | Levinson | H01L 21/67011 |
| | | | 134/6 |
| 2008/0316441 A1* | 12/2008 | Liebregts | G03F 7/70975 |
| | | | 355/30 |
| 2011/0170085 A1 | 7/2011 | Sijben | |
| 2012/0024318 A1 | 2/2012 | Itoh et al. | |
| 2012/0027557 A1 | 2/2012 | Ashdown et al. | |
| 2016/0018744 A1* | 1/2016 | Lafarre | G03F 7/70716 |
| | | | 156/60 |

OTHER PUBLICATIONS

International Search Report and Written Opinion of the International Searching Authority directed to related International Patent Application No. PCT/EP2020/051775, dated May 4, 2020; 10 pages.

Ko et al., "A double-sided electret polymer film-based electrostatic actuator," Proc. of SPIE, vol. 6927, Electroactive Polymer Actuators and Devices (EAPAD), Apr. 10, 2008; pp. 1-10.

Research Disclosure, Kenneth Mason Publications, vol. 563, No. 8, Mar. 1, 2011; 2 pages.

* cited by examiner

Forces at RTC unload
Stage 700μm above reticle

FIG. 4

COMPONENT FOR USE IN A LITHOGRAPHIC APPARATUS, METHOD OF PROTECTING A COMPONENT AND METHOD OF PROTECTING TABLES IN A LITHOGRAPHIC APPARATUS

CROSS-REFERENCE TO RELATED APPLICATIONS

This application claims priority of EP application number 19156202.4 which was filed on 8 Feb. 2019 and which is incorporated herein in its entirety by reference.

FIELD

The present invention relates to components for use in a lithographic apparatus, methods of manufacturing components and methods of protecting tables in a lithographic apparatus. In particular, but not exclusively, the components may be reticles or protective plates which substitute for reticles. The present invention has particular, but not exclusive, use in connection with EUV lithographic apparatus and EUV lithographic reticles.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

The wavelength of radiation used by a lithographic apparatus to project a pattern onto a substrate determines the minimum size of features that can be formed on that substrate. A lithographic apparatus that uses EUV radiation, that is electromagnetic radiation having a wavelength within the range 4-20 nm, may be used to form smaller features on a substrate than a lithographic apparatus using DUV radiation (for example with a wavelength of 193 nm).

Dust or other contaminants on a patterning device in a lithographic apparatus can be particularly troublesome as a dust particle or other contaminant might be imaged on each device that is made. If the effect on the manufactured pattern prevents the device from functioning properly, the yield will be severely impacted until the patterning device can be cleaned. Measures to minimise contamination in the lithographic apparatus, especially in the vicinity of the patterning device, are very important.

Similarly, dust or other contaminants on the support structure to which the patterning device is mounted can cause problems as they can affect the accuracy with which the patterning device can be positioned and orientated. The support table to which the patterning device is mounted is typically formed with a plurality of burls extending from a main body of the support structure.

In order to protect the patterning device from contamination when it is not in use, it can be removed from the support structure and housed in a protective casing. However, that can leave the support structure exposed to contamination. For example, during cleaning, venting and/or flushing operations, there are high gas flows through the lithographic apparatus. Similarly during transport of a lithographic apparatus, the patterning device will often not be installed, to prevent damage and/or contamination, but it will still be desirable to protect the surface of the support structure.

A way of protecting the surface of the support structure is to provide a flat plate which is positioned in place of the patterning device. Such plates are sometimes referred to as "protective reticles", even though they have no pattern themselves.

In traditional lithographic apparatus, the reticles (and the protective plates or "protective reticles") are often clamped to a support structure using vacuum clamping in which a pressure differential is formed between an outer surface of the reticle and a rear surface (in the direction of the support structure) thus clamping the reticle/protective plate to the support structure. Vacuum clamping may also be used to hold other components in a lithographic apparatus in place.

However, some lithographic apparatuses, particularly those using EUV radiation, operate at low pressures, such that it is not possible to create a sufficient pressure differential across the reticle or other component in order to hold the component in place. In such apparatuses, the components may be clamped electrostatically by applying a voltage to the support structure (or other part of the apparatus to which the component is being secured) such that a potential difference is created between the component and the apparatus thus clamping the two together.

However, the electrostatic voltages required for such clamping, at the very least to overcome the gravitational forces acting on a suspended component such as a reticle, are typically in the high 100s of volts. In a low pressure environment such voltages can be unsafe (the intrinsically safe voltage limit at the typical pressures used is around ~250V). This is particularly the case when the pressure is increased for flushing or venting, while it can also be particularly important to protect the support structure (or other part of the apparatus) from contamination in such operations.

Some lithographic apparatuses address this latter problem by placing the reticle within feet which act as a safety catch. However, this approach suffers from the significant drawbacks that there is mechanical contact and wear between the reticle and the safety catch feet which can be a major source of defects in subsequent loading of reticles as a result of particles left on the feet.

SUMMARY

An object of the present invention is to provide an alternative way of clamping components such as reticles and plates used to protect the support structure, in particular in a lithographic apparatus which operates at low pressures.

It is a further object of the present invention to provide a component, such as a reticle, which can be clamped in a low pressure environments. It is a further object of the present invention to provide a component that can be clamped without applying an external force or voltage.

In an embodiment of the present invention there is provided a method of protecting a component of a lithographic apparatus, the method including the steps of: providing a protective cover which is shaped to protect at least part of said component, the protective cover having a contact surface which is arranged to adhere to a first surface of at least part of said lithographic apparatus or said component; and bringing the protective cover into proximity with the component so as to cause the contact surface to adhere to the lithographic apparatus or said component and remain adhered without the application of external force.

In a further embodiment of the present invention there is provided a patterning device for use in a lithographic apparatus, the patterning device having a pattern formed therein which, when irradiated in the lithographic apparatus from a first side, is projected onto a substrate, the patterning device having a second side, opposed to side first side, which is arranged to adhere to a support structure in the lithographic apparatus when contacted with the support structure, and remain adhered thereto without the application of external force.

In a further embodiment of the present invention there is a provided a lithographic apparatus comprising: a patterning device according to the above embodiment; an illumination system configured to illuminate the patterning device with EUV radiation; and a projection system configured to project radiation patterned by the patterning device onto a substrate.

In a further embodiment of the present invention there is provided a lithographic apparatus comprising: a support structure arranged to support a patterning device, the support structure comprising a main body having a main body surface and a plurality of burls projecting from the main body surface and each having a distal end surface configured to engage with the patterning device, wherein the main body surface has a coating between said burls which includes a plurality of thin-film electrets which are arranged to adhere to a rear surface of the patterning device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

The term "reticle" as employed in this text may be broadly interpreted as referring to a generic patterning device that can be used to endow an incoming radiation beam with a patterned cross-section, corresponding to a pattern that is to be created in a target portion of the substrate. The term "reticle" as employed in this text, particularly but not exclusively when referred to as a "protective reticle", may also include components which are designed to be used in the same positions in a lithographic apparatus as the generic patterning devices referred to above, for example during portions of the operation of the apparatus which do not require illumination of a substrate.

Figure 1:
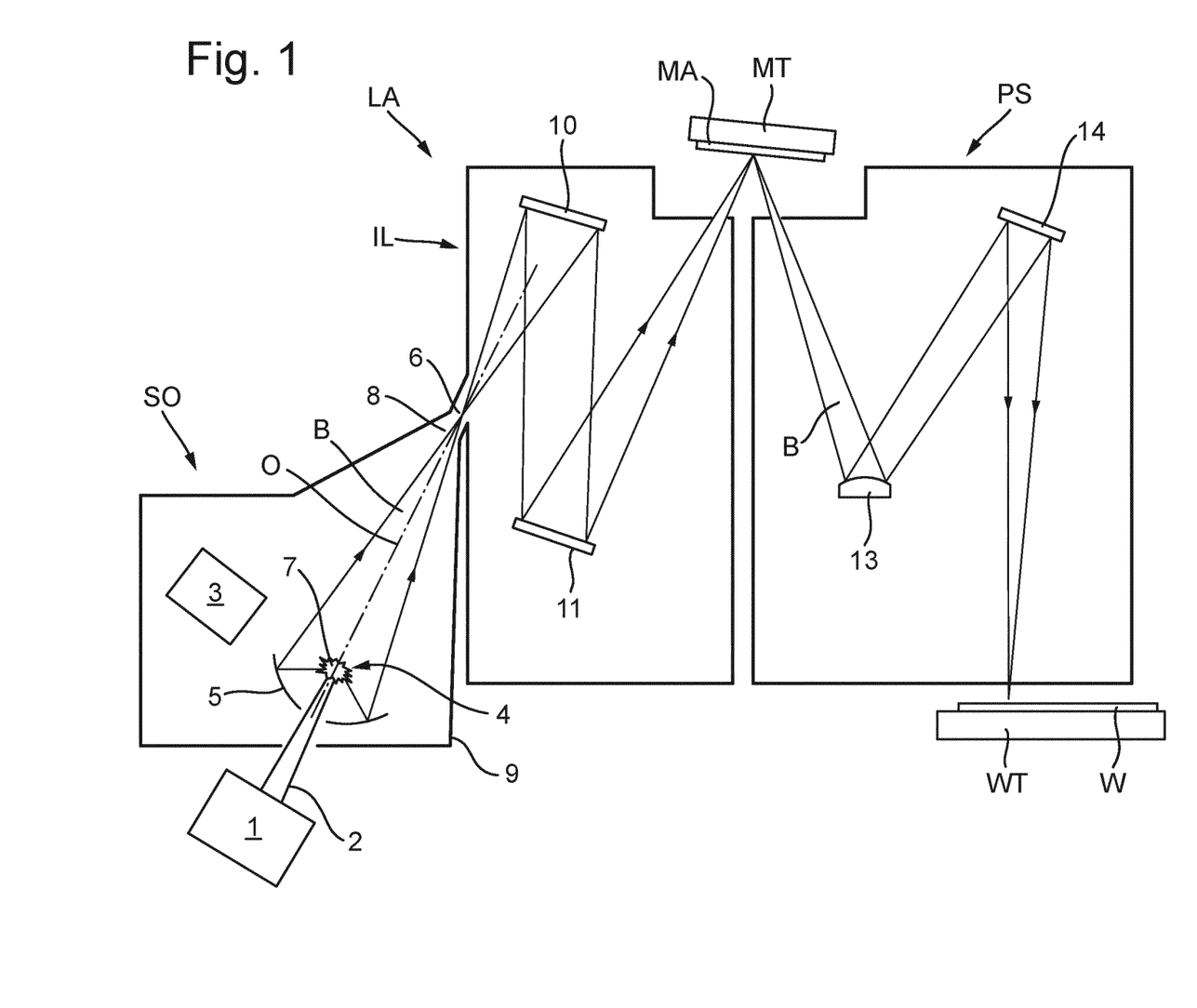
FIG. 1 is a schematic illustration of a lithographic system comprising a lithographic apparatus and a radiation source.

FIG. 1 is a schematic illustration of a lithographic system. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a patterning device MA, a projection system PS and a substrate table WT configured to support a substrate W.

The illumination system IL is configured to condition the radiation beam B before it is incident upon the patterning device MA. The projection system is configured to project the radiation beam B (now patterned by the patterning device MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g. hydrogen) may be provided in the radiation source SO. A vacuum may be provided in the illumination system IL and/or the projection system PS. A small amount of gas (e.g. hydrogen) at a pressure well below atmospheric pressure may be provided in the illumination system IL and/or the projection system PS.

The radiation source SO shown in FIG. 1 is of a type that may be referred to as a laser produced plasma (LPP) source. A laser 1, which may for example be a $CO_2$ laser, is arranged to deposit energy via a laser beam 2 into a fuel, such as tin (Sn) that is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, for example, in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure that is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

In other embodiments of a laser produced plasma (LPP) source the collector 5 may be a so-called grazing incidence collector that is configured to receive EUV radiation at grazing incidence angles and focus the EUV radiation at an intermediate focus. A grazing incidence collector may, for example, be a nested collector, comprising a plurality of grazing incidence reflectors. The grazing incidence reflectors may be disposed axially symmetrically around an optical axis O.

The radiation source SO may include one or more contamination traps (not shown). For example, a contamination trap may be located between the plasma formation region 4 and the radiation collector 5. The contamination trap may for example be a rotating foil trap, or may be any other suitable form of contamination trap.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA (which may for example be a mask) reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 that are configured to project the radiation beam B onto a substrate W held by the substrate table WT. The mirrors 13, 14 which form the projection system may be configured as reflective lens elements. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The lithographic apparatus may, for example, be used in a scan mode, wherein the support structure (e.g. mask table) MT and the substrate table WT are scanned synchronously while a pattern imparted to the radiation beam is projected onto a substrate W (i.e. a dynamic exposure). The velocity and direction of the substrate table WT relative to the support structure (e.g. mask table) MT may be determined by the demagnification and image reversal characteristics of the projection system PS. The patterned radiation beam that is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

The radiation source SO and/or the lithographic apparatus that is shown in FIG. 1 may include components that are not illustrated. For example, a spectral filter may be provided in the radiation source SO. The spectral filter may be substantially transmissive for EUV radiation but substantially blocking for other wavelengths of radiation such as infrared radiation.

In other embodiments of a lithographic system the radiation source SO may take other forms. For example, in alternative embodiments the radiation source SO may comprise one or more free electron lasers. The one or more free electron lasers may be configured to emit EUV radiation that may be provided to one or more lithographic apparatuses.

In use, a masking system may be disposed such that it can be moved into and out of the optical path of radiation between the illumination system IL and the projection system PS. Such a masking system provides control over the distribution of radiation in field planes of the lithographic apparatus that are downstream of the apparatus. Such field planes include the plane of the support structure MT (i.e. the plane of a patterning device MA) and the plane of the substrate table WT (i.e. the plane of a substrate W).

Embodiments of the invention provide a range of approaches by which a component, such as a reticle or a protective plate which takes the place of the reticle, may be clamped in a non-powered fashion (i.e. without applying an external force or voltage), particularly during the flushing, venting, maintenance, transport and/or handling of the lithographic apparatus to a component of the apparatus that needs to be protected from contamination. For simplicity, the embodiments will refer to "reticles" and "protective plates" and the clamping of reticles and protective plates, but it will be appreciated that the principles in those embodiments can be used with any other component which it is desired to maintain in position in a low-pressure environment, such as a substrate.

In a first embodiment, the reticle or protective plate is provided with a charged thin-film electret coating on one surface of the reticle/plate which, in use, contacts the support structure. Thin-film electrets are known, for example in the fields of speakers and microphones, and these can be pre-charged to several 100's of volts. Examples of such films are standard PTFE or polymer blends such as cyclo-olefin copolymers with polystyrene (COC/PS). The exact choice of coating may be based on a range of factors, including but not limited to: cost, mechanical properties and/or charge storage properties.

Figure 2:
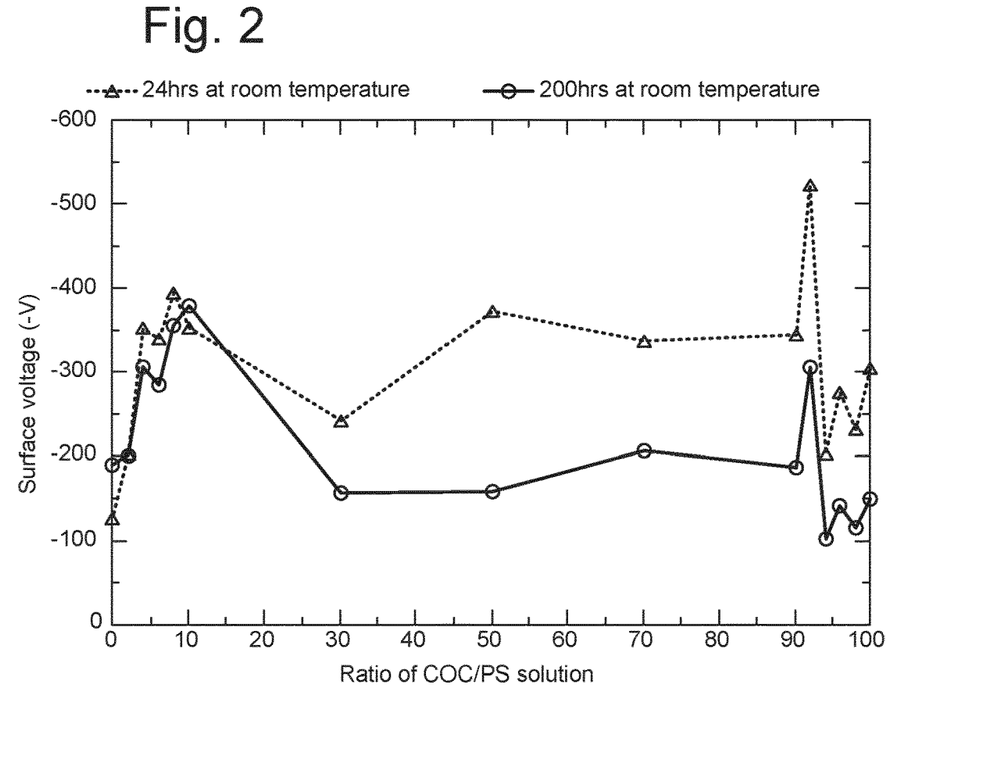
FIG. 2 is a graph showing the charge conservation at various time intervals by thin-film electrets.

FIG. 2, taken from Ko, Wen-Ching & Chen, Jia-Lun & Wu, Wen-jong & Lee, Chih-Kung. (2008). A double-sided electret polymer film-based electrostatic actuator. Proc SPIE. 6927. 10.1117/12.776002, shows the charge conservation of thin-film electrets in a range of COC/PS films.

The plots in FIG. 2 show that, even without applying any voltage to the clamps, a protective plate or reticle coated with COC/PS can stick electrostatically for several days. Specifically, the upper (triangles) plot in FIG. 2 shows that thin-film electrets can easily have and retain the required voltage for electrostatic clamping of a protective plate (e.g. ~300V for clamping a reticle in an EUV lithography mashing) for the duration of a flushing (<1 h) or venting (<48 h) sequence. The lower (circles) plot in FIG. 2 further shows that, if properly engineered, an appropriate charge can also be maintained for over >1 week allowing for its use during transport and other handling operations.

Moreover, as shown in FIG. 2, thin-film electrets can hold >500V for >1 hour, which is significantly longer than duration of a lithographic lot. For a 10 micron gap (e.g., 402 of FIG. 4) between reticle and clamp surface, this results in a potential clamping electrical field of >50 Mv/m, which is similar to the current clamping electrical field which is applied in electrostatic clamping during scanning. Thus, this principle (and those in the subsequent embodiments) could be extended to imaging reticles. For imaging reticles, it is desirable to achieve a high degree of flatness in the contact between the reticle and the support structure/mask table (401). This may be achieved, for example, by applying the electret film (408) everywhere on the rear surface of the reticle (406) except for the locations of the burl contact points which would remain as an ultra-low-expansion material. In this arrangement the clamp design for an imaging reticle could be simplified into a passive electrical component.

Figure 4:
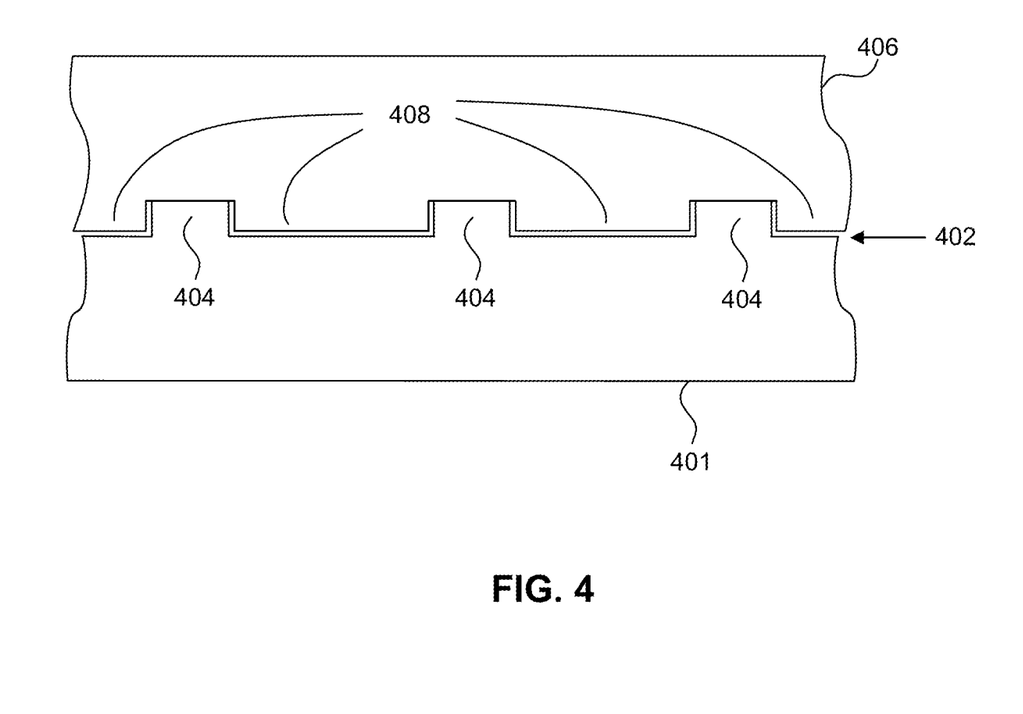
FIG. 4 illustrates a component, such as a reticle or protective plate, according to an aspect of the application.

In an alternative arrangement the electret layer could be provided on the support structure, below or in between the burls (404), so as to create a clamping electrical field on the reticle or protective plate (406).

After the desired operation (e.g. flushing/venting/exposure) is complete, the release and unloading of the reticle/plate can be accomplished by a mechanical release mechanism or increasing the backfill gas pressure between the support structure and the reticle/plate (e.g. to >1 kPa). Alternatively, release can be achieved by setting the clamp electrodes to a common repelling (same-sign) voltage with respect to the reticle coating.

In a second embodiment, one surface of the reticle or protective plate is coated with a coating which results in contact electrification when the plate is contacted with the burls of the support structure (or, more specifically, with the burl coating). Examples of such a coating are Kapton or polyurethane. The exact choice of material may be made dependent on the nature of the burl coating to which the reticle/plate is to be attached.

Contact electrification is process by which two (normally dissimilar) materials are brought into contact and then separated, causing charged particles (electrons) to be passed from one to the other, thus building up a potential between the materials.

Materials with either positive or negative electron-affinity with respect to the burls/burl coating may be chosen. If appropriate, then repeated clamping and unclamping/releasing may be performed in order to build up the requisite electrostatic charge on the reticle coating. The repeated clamping/unclamping may be carried out with deliberate changes in position in order to build up the charge on as much of the coating as possible.

Figure 3:
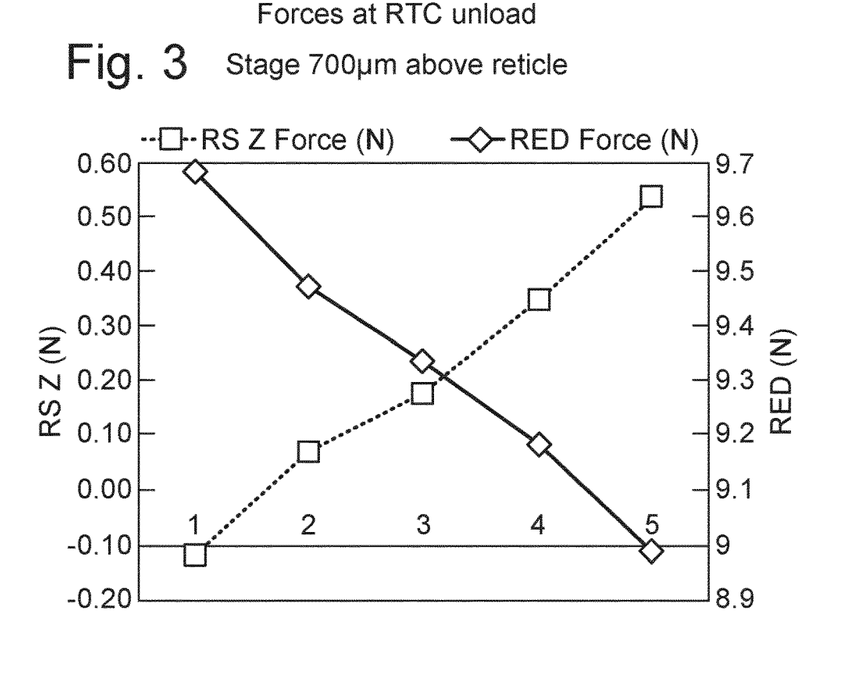
FIG. 3 is a graph showing how contact electrification causes attractive forces between a support structure and a component that is brought into contact with it over repeated contacts.

FIG. 3 shows how the electrostatic force (y axis) between a plate and the support structure increases with repeated contacts (x axis). The line marked "RS Z Force" is the force measured on the reticle stage (clamp). The line marked "RED Force" is the force on the reticle exchange device on which the reticle is held after de-clamping. FIG. 3 shows these forces at the time when the reticle is de-clamped and lying on the reticle exchange device after 1-5 repeated contacts. An electrostatic attraction force between reticle and clamp registers as a pull downwards on the clamp (a non-zero "RS Z Force") and also as an apparent reduction in the gravitational force experienced by the reticle exchange device (a lowered "RED Force"). Measurement of these forces can also be used to measure the charge on the reticle resulting from the contact electrification.

Release of the reticle/plate after the required operation has been completed can be accomplished as described in relation to the first embodiment above.

In a third embodiment, one surface of the reticle or protective plate is coated with a non-metallic coating which causes that surface to adhere to the support structure.

A range of organic-based sticky pads/coatings are commercially available which provide sufficient adhesion to overcome the gravitational forces on the reticle while leaving little or no residue behind when the reticle is removed. For example, the coating may be polyurethane, which is known to be "sticky" without leaving any residue on materials that it sticks to, and for that reason is used for "sticky mats" in clean room entrances.

By applying a polyurethane coating to the rear surface (or part of the rear surface) of the reticle or protective plate, this could provide sufficient adhesive force to keep the reticle or protective plate stuck to the support structure, even during flushing/venting.

Release of the reticle/plate after the required operation has been completed can be accomplished as described in relation to the first embodiment above.

In a fourth embodiment, one surface of the reticle or protective plate is coated with a metallic coating which causes that surface to adhere to the support structure.

In a near-vacuum or neutral gas environment, metals can form strong bonds to other (miscible) metals or to metal-oxides. In this implementation the protective plate to be used during flushing or venting is coated with a non-oxidizing metal to promote inter-metallic bonding (also referred to as "cold welding") upon clamping, which will remain an effective clamping force even after removing the force which causes the protective plate to contact the support structure (which may be a mechanical force, or an initial clamping voltage). For example, the protective plate may be coated with gold or another inert metal. The gold (or other inert metal) may be further treated, for example with platinum, to reduce or prevent molecules from sticking on contact with the coating of the support structure.

As a refinement, the level of adhesive force could be increased by conditioning the surface of the burls and/or reticle surface prior to contacting the protective plate, to make the burls and/or reticle more metallic (or more generally, more reactive). For example, such conditioning may involve deliberate exposure to EUV and/or H-plasma.

Release of the reticle or plate after the required operation has been completed can be accomplished as described in relation to the first embodiment above.

In certain embodiments the electrostatic force measurement shown in FIG. 3 can also be used to actively verify that sufficient force is being applied to hold the protective plate or reticle securely in place.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the clauses set out below.

1: A method of protecting a component of a lithographic apparatus, the method including the steps of: providing a protective cover that is shaped to protect at least part of said component, the protective cover having a contact surface that is arranged to adhere to a first surface of at least part of said lithographic apparatus or said component; and
bringing the protective cover into proximity with the component so as to cause the contact surface to adhere to the lithographic apparatus or said component and remain adhered without the application of external force.

2: A method according to clause 1 wherein said first surface is a surface of the component.

3: A method according to clause 1 wherein said first surface is adjacent to the component.

4: A method according to any one of the preceding clauses wherein the contact surface includes a coating that is configured to adhere to said first surface.

5: A method according to clause 4 wherein the coating includes a plurality of thin-film electrets.

6: A method according to clause 4 wherein the coating is a material that has a different electron affinity to the first surface, such that contact between the first surface and the contact surface causes contact electrification between said surfaces.

7: A method according to clause 6 wherein the step of bringing the protective cover into contact involves contacting and removing the protective cover a plurality of times, thereby increasing the adhesion due to contact electrification between the contact surface and the first surface.

8: A method according to any one of clauses 4 to 7 wherein the coating is a non-metallic coating.

9: A method according to clause 4 wherein the coating is a metallic coating comprising an inert metal that is arranged to form inter-metallic bonds on contact with the first surface.

10: A method according to any one of the preceding clauses, further including the step of treating either the first surface or the contact surface to improve the adhesion, prior to bringing the protective cover into contact with the component.

11: A method according to any one of the preceding clauses, wherein the method is carried out as part of an operation of flushing, venting, maintenance, transport or other movement of the lithographic apparatus.

12: A method according to any one of the preceding clauses, further including the step of removing the protective cover from the component by either: applying a pressure differential across the protective cover; applying a mechanical force to the component; or applying an electrostatic potential to the component so as to repel the protective cover.

13: A method according to any one of the preceding clauses wherein the component is a support structure comprising a main body having a main body surface and a plurality of burls projecting from the main body surface and each having a distal end surface configured to engage with a removable element, and wherein the protective cover is arranged to cover said burls.

14: A method according to clause 13 as dependent on clause 12 wherein the step of removing includes supplying a gas to a region between the burls, the main body surface and the protective cover so as to increase the pressure in said region above the pressure outside said region.

15: A method according to clause 13 or clause 14 wherein the main body surface has a coating between said burls that includes a plurality of thin-film electrets.

16: A patterning device for use in a lithographic apparatus, the patterning device having a pattern formed therein that, when irradiated in the lithographic apparatus from a first side, is projected onto a substrate, the patterning device having a second side, opposed to side first side, that is arranged to adhere to a support structure in the lithographic apparatus when contacted with the support structure, and remain adhered thereto without the application of external force.

17: A patterning device according to clause 16 wherein the second side has a coating that is configured to adhere to said support structure.

18: A patterning device according to clause 17 wherein the coating includes a plurality of thin-film electrets.

19: A patterning device according to clause 17 wherein the coating is a material that has a different electron affinity to the support structure, such that contact between the second side and the support structure causes contact electrification between them.

20: A patterning device according to clause 17 wherein the coating is a metallic coating comprising an inert metal that is arranged to form inter-metallic bonds on contact with the support structure.

21: A lithographic apparatus comprising: a patterning device according to any one of clauses 16 to 20; an illumination system configured to illuminate the patterning device with EUV radiation; and a projection system configured to project radiation patterned by the patterning device onto a substrate.

22: A lithographic apparatus comprising: a support structure arranged to support a patterning device, the support structure comprising a main body having a main body surface and a plurality of burls projecting from the main body surface and each having a distal end surface configured to engage with the patterning device, wherein the main body surface has a coating between said burls that includes a plurality of thin-film electrets that are arranged to adhere to a rear surface of the patterning device.

The invention claimed is:

1. A method comprising:
providing a protective reticle cover or reticle that is shaped to protect at least part of a component of a lithographic apparatus, the protective reticle cover or the reticle having a contact surface that is arranged to adhere to at least part of the component; and
bringing the protective reticle cover or the reticle into proximity with the component so as to cause the contact surface to adhere to the component and remain adhered without the application of external force,
wherein the component is a support structure comprising a main body having a main body surface and a plurality of burls projecting from the main body surface and each having a distal end surface configured to engage with the protective reticle cover or the reticle, and wherein the protective reticle cover is arranged to cover the burls, and
wherein the protective reticle cover or the reticle has a coating comprising a plurality of thin-film electrets to form an attractive force between the component and the protective reticle cover or the reticle.

2. The method of claim 1, wherein the coating is a non-metallic coating.

3. The method of claim 1, wherein the method is carried out as part of an operation of flushing, venting, maintenance, transport or other movement of the lithographic apparatus.

4. The method of claim 1, further comprising removing the protective reticle cover from the component by either: applying a pressure differential across the protective reticle cover; applying a mechanical force to the component; or applying an electrostatic potential to the component so as to repel the protective reticle cover.

5. The method of claim 4, wherein:
the removing includes supplying a gas to a region between the burls, the main body surface and the protective reticle cover or the reticle so as to increase a pressure in the region above a pressure outside the region.

6. A patterning device comprising:
a pattern formed therein that, when irradiated in a lithographic apparatus from a first side, is projected onto a substrate; and
a second side, opposed to the first side, that is arranged to adhere to a support structure in the lithographic apparatus when contacted with the support structure, and to remain adhered thereto without the application of external force, the second side having a coating that is configured to adhere to the support structure,
wherein the support structure comprises a main body having a main body surface and a plurality of burls projecting from the main body surface and each having a distal end surface configured to engage with the patterning device, and wherein the patterning device is arranged to cover the burls, and
wherein the coating comprises a plurality of thin-film electrets to form an attractive force between the patterning device and the support structure to achieve the adhering.

7. A lithographic apparatus comprising the patterning device of claim 6.

* * * * *